(12) United States Patent
Kanaya et al.

(10) Patent No.: US 8,728,866 B2
(45) Date of Patent: May 20, 2014

(54) METHOD FOR MANUFACTURING SEMICONDUCTOR DEVICE

(75) Inventors: Ko Kanaya, Tokyo (JP); Yoshihiro Tsukahara, Tokyo (JP); Shinsuke Watanabe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 32 days.

(21) Appl. No.: 13/079,055

(22) Filed: Apr. 4, 2011

(65) Prior Publication Data

US 2012/0025366 A1 Feb. 2, 2012

(30) Foreign Application Priority Data

Jul. 29, 2010 (JP) ................................. 2010-170570

(51) Int. Cl.
*H01L 21/50* (2006.01)
*H01L 23/04* (2006.01)

(52) U.S. Cl.
CPC ................ *H01L 21/50* (2013.01); *H01L 23/04* (2013.01)
USPC ........... 438/113; 438/114; 438/465; 257/693; 257/704; 257/E23.18

(58) Field of Classification Search
CPC ................................. H01L 21/50; H01L 23/04
USPC .................. 438/113, 114, 465; 257/693, 704, 257/E23.18
See application file for complete search history.

(56) References Cited

U.S. PATENT DOCUMENTS

| 5,703,397 | A | 12/1997 | Endo et al. |
| 7,456,497 | B2 | 11/2008 | Higashi |
| 7,495,462 | B2 | 2/2009 | Hua et al. |
| 7,821,125 | B2 | 10/2010 | Tokita et al. |

(Continued)

FOREIGN PATENT DOCUMENTS

| DE | 10 2007 038 169 A | 3/2008 |
| EP | 1 353 373 A2 | 10/2003 |

(Continued)

OTHER PUBLICATIONS

German Patent Office, Official Action in German Patent Application No. 10 2011 079 105.1 (Nov. 2, 2012).

(Continued)

*Primary Examiner* — Zandra Smith
*Assistant Examiner* — Toniae Thomas
(74) *Attorney, Agent, or Firm* — Leydig, Voit & Mayer, Ltd.

(57) ABSTRACT

A method for manufacturing a semiconductor device comprises: forming a circuit pattern and a first metal film on a first major surface of a body wafer; forming a through-hole penetrating the body wafer from a second major surface of the body wafer and reaching the first metal film; forming a second metal film on a part of the second major surface of the body wafer, on an inner wall of the through-hole, and on the first metal film exposed in the through-hole; forming a recess on a first major surface of a lid wafer; forming a third metal film on the first major surface of the lid wafer including inside the recess of the lid wafer; with the recess facing the circuit pattern, and the first metal film contacting the third metal film, joining the lid wafer to the body wafer; and dicing the joined body wafer and lid wafer along the through-hole.

8 Claims, 20 Drawing Sheets

(56) References Cited

U.S. PATENT DOCUMENTS

| | | |
|---|---|---|
| 2006/0022325 A1 | 2/2006 | Hwang et al. |
| 2007/0004079 A1 | 1/2007 | Geefay et al. |
| 2008/0081398 A1 | 4/2008 | Lee et al. |
| 2008/0150118 A1* | 6/2008 | Van Veen et al. ............. 257/688 |
| 2009/0039503 A1 | 2/2009 | Tokita et al. |
| 2010/0038776 A1 | 2/2010 | Bessemoulin |

FOREIGN PATENT DOCUMENTS

| | | |
|---|---|---|
| JP | 5-243417 A | 9/1993 |
| JP | 2001-24079 A | 1/2001 |
| JP | 2004-209585 A | 7/2004 |
| JP | 2005-57136 A | 3/2005 |
| JP | 2005-251898 A | 9/2005 |
| JP | 2006-41532 A | 2/2006 |
| JP | 2007-13174 A | 1/2007 |
| JP | 2008-306064 A | 12/2008 |

OTHER PUBLICATIONS

German Patent Office; Office Action in German Patent Application No. 10 2011 122918.7 (Jan. 10, 2014).

Taiwan Patent Office; Office Action in Taiwan Patent Application No. 100111754 (Jan. 21, 2014).

* cited by examiner

METHOD FOR MANUFACTURING SEMICONDUCTOR DEVICE

BACKGROUND OF THE INVENTION

1. Field of the Invention

The present invention relates to a semiconductor device and a method for manufacturing the same wherein a lid wafer having a recess is joined to a body wafer having a circuit pattern.

2. Background Art

In recent years, applications using millimeter wave band, such as 60 GHz-band WPAN (Wireless Personal Area Network) and 76 GHz-band on-board millimeter wave radars, have been increased. These applications need semiconductor devices having high gain in millimeter wave band. Although a semiconductor device wherein semiconductor chips are sealed with a mold can reduce manufacturing costs, parasitic capacitance increases and the performance of the device deteriorates. In particular, the quantity of deterioration is marked in the millimeter wave band. In addition, the moisture resistance is not sufficiently maintained. Therefore, a semiconductor device wherein a lid wafer having a recess is joined to a body wafer having a circuit pattern formed has been proposed. Thereby, the circuit pattern is air-tightly sealed to improve moisture resistance, and gain lowering by parasitic capacitance can be repressed.

Furthermore, there is a problem wherein if a part of signals are fed back in a device, undesired oscillation is generated in the amplifier, or oscillation signals become misaligned in the oscillator. Particularly, since millimeter waves have short wavelength, self interference cannot be ignored. Therefore, a semiconductor device wherein an electromagnetic shield is provided on the inner surface of a lid wafer for covering the circuit pattern has been proposed (for example, refer to FIG. 11 in Japanese Patent Laid-Open No. 2005-57136).

Further, a semiconductor device wherein a circuit pattern is provided on the inner surface of a lid wafer and is connected to the circuit pattern of a body wafer has also been proposed (for example, refer to FIG. 10 in Japanese Patent Laid-Open No. 2005-57136). Thereby, the chip size can be reduced.

SUMMARY OF THE INVENTION

The body wafer and the lid wafer are joined in a vacuum by plasma activation joining or the like. At this time, the chip may dent due to difference between the atmospheric pressures of inside and outside of the device. In this case, distances to the circuit pattern and to the lid change, and problems of the gap between the designed value and the actual value are caused. In order to prevent these problems, the body wafer or the lid wafer must be thickened. Therefore, the dicing accuracy is lowered, the dicing speed (throughput) is lowered, and the blade costs are increased. Furthermore, the dicing line must be widened, and the number of chips per wafer is reduced.

Although a semiconductor device having a reduced chip size by providing the circuit pattern on the inner surface of the lid wafer has also been proposed, the further reduced chip size is required.

The emitter of the HBT formed on the body wafer was also grounded, and the heat was dissipated via the through-hole of the air bridge and the body wafer. Therefore, there was a problem wherein poor heat dissipation and high parasitic inductance.

Heretofore, in order to prevent change in the oscillation frequency of the oscillator by the output signals of the amplifier, the amplifier and the oscillator were formed on separate chips, and an electromagnetic shield was provided inside the lid wafer of either chip. However, there was a problem of increase in the device size and manufacturing costs.

In order to solve the above-described problems, the first object of the present invention is to obtain a method for manufacturing a semiconductor device that can improve moisture resistance, suppress gain lowering, prevent exterior electromagnetic noise, and efficiently perform dicing. The second object of the present invention is to obtain a semiconductor device that can reduce the chip size. The third object of the present invention is to obtain a semiconductor device that can improve heat dissipation and lower parasitic inductance. The fourth object of the present invention is to obtain a semiconductor device and a method for manufacturing the same that can prevent exterior electromagnetic noise, and reduce the device size and the manufacturing costs.

According to the present invention, a method for manufacturing a semiconductor device comprises: forming a circuit pattern and a first metal film on a first major surface of a body wafer having the first major surface and a second major surface facing to each other; forming a through-hole penetrating the body wafer from the second major surface of the body wafer and reaching the first metal film; forming a second metal film on a part of the second major surface of the body wafer, on an inner wall of the through-hole, and on the first metal film exposed in the through-hole; forming a recess on a first major surface of a lid wafer having the first major surface and a second major surface facing to each other; forming a third metal film on the first major surface including inside the recess of the lid wafer; making the recess to face to the circuit pattern, making the first metal film to contact the third metal film, and joining the lid wafer to the body wafer; and dicing the joined body wafer and lid wafer along the through-hole.

The present invention makes it possible to obtain a method for manufacturing a semiconductor device that can improve moisture resistance, suppress gain lowering, prevent exterior electromagnetic noise, and efficiently perform dicing.

Other and further objects, features and advantages of the invention will appear more fully from the following description.

DETAILED DESCRIPTION OF THE PREFERRED EMBODIMENTS

A semiconductor device and a method for manufacturing the same according to the embodiments of the present invention will be described with reference to the drawings. The same components will be denoted by the same symbols, and the repeated description thereof may be omitted.

First Embodiment

Figure 1:
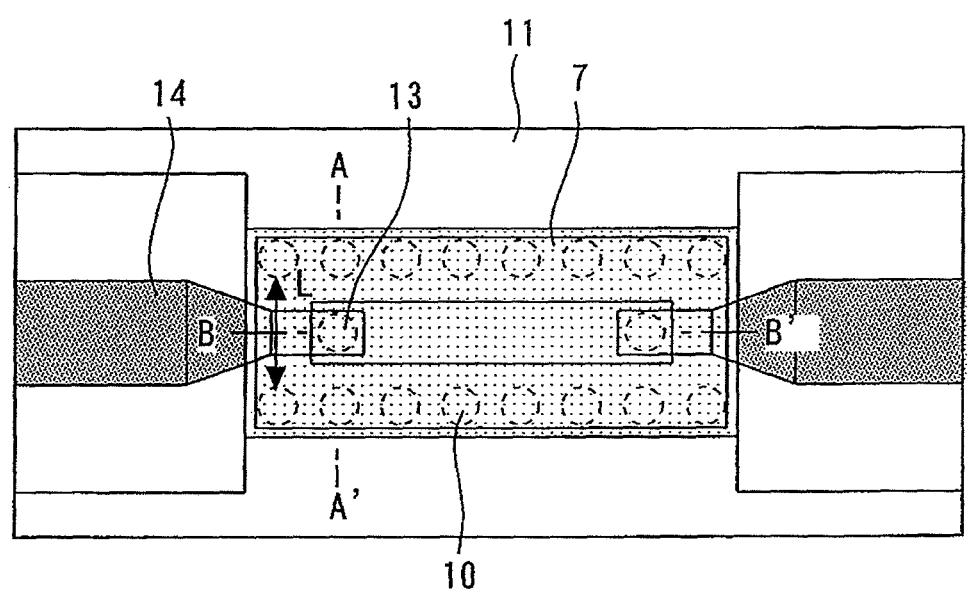
FIG. 1 is a plan view showing a semiconductor device according to the first embodiment.
Figure 2:
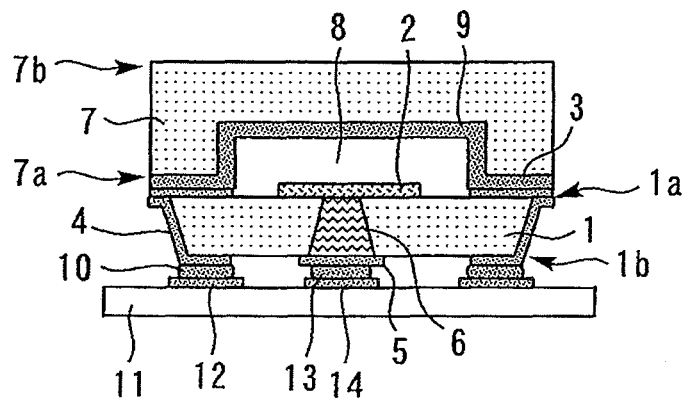
FIG. 2 is a sectional view taken along the line A-A' in FIG. 1.
Figure 3:
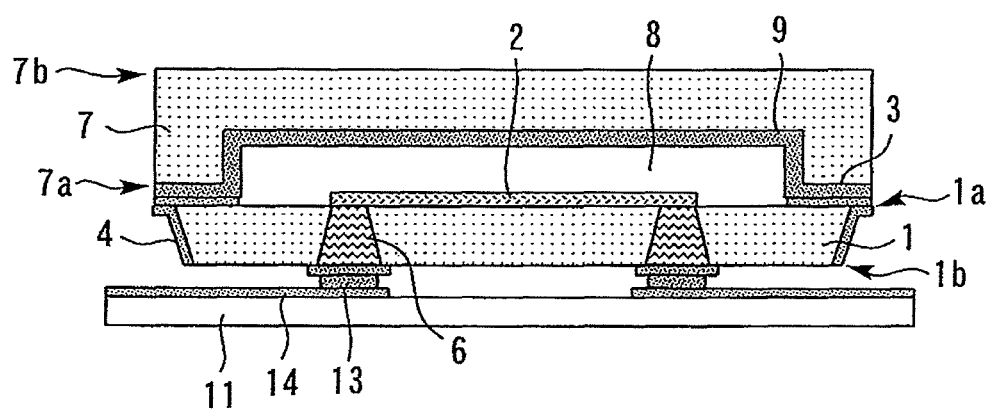
FIG. 3 is a sectional view taken along the line B-B' in FIG. 1.

FIG. 1 is a plan view showing a semiconductor device according to the first embodiment. FIG. 2 is a sectional view taken along the line A-A' in FIG. 1. FIG. 3 is a sectional view taken along the line B-B' in FIG. 1.

A body wafer 1 has a major surface 1a and a major surface 1b facing to each other. A circuit pattern 2 and a metal film 3 are formed on the major surface 1a of the body wafer 1.

A metal film 4 is formed on the side surface of the body wafer 1 and a part of the major surface 1b, and the metal film 4 is connected to the metal film 3. A pad 5 for inputting/outputting signals is formed on the major surface 1b of the body wafer 1. The pad 5 for inputting/outputting signals is connected to the circuit pattern 2 by penetrating electrodes 6 penetrating through the body wafer 1.

The circuit pattern 2 is a circuit pattern for an amplifier and an oscillator, and has transistors, resistors, MIM capacitors, spiral inductors, wirings and the like. The through-holes of the penetrating electrodes 6 are filled with gold for reducing parasitic inductance and thermal resistance. In addition, although not shown in the drawings, penetrating electrodes and pads for grounding the circuit are also formed.

A lid wafer 7 has a major surface 7a and a major surface 7b facing to each other. A recess 8 is formed on the major surface 7a of the lid wafer 7. A metal film 9 is formed on the major surface 7a of the lid wafer 7 including inside the recess 8. The lid wafer 7 is joined to the body wafer 1 with the recess 8 facing to the circuit pattern 2, and with the metal film 9 contacting to the metal film 3.

The metal film 4 on the major surface 1b of the body wafer 1 is connected to the grounding line 12 on the substrate 11 via the grounding bump 10. The pad 5 for inputting/outputting signals on the major surface 1b of the body wafer 1 is connected to the signal line 14 on the substrate 11 via the bump 13 for inputting/outputting signals.

Next, a method for manufacturing a semiconductor device according to the first embodiment will be described. FIGS. 4 to 12 are sectional views for illustrating a method for manufacturing a semiconductor device according to the first embodiment.

Figure 4:
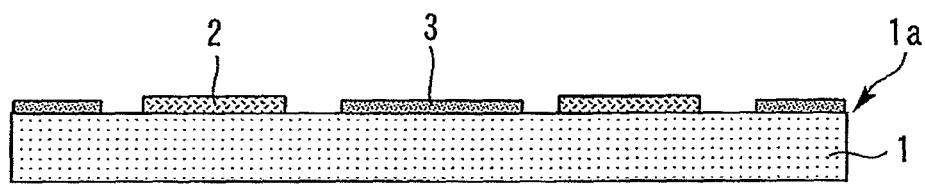
FIGS. 4 to 12 are sectional views for illustrating a method for manufacturing a semiconductor device according to the first embodiment.

First, as shown in FIG. 4, a circuit pattern 2 and a metal film 3 are formed on the major surface 1a of a body wafer 1.

Figure 5:
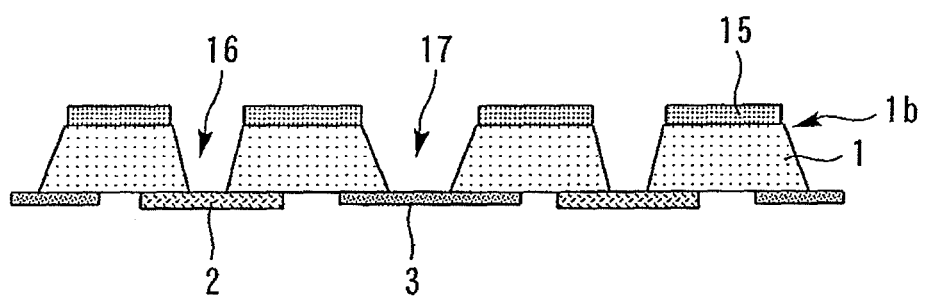

Next, as shown in FIG. 5, a resist pattern 15 is formed on the major surface 1b of the body wafer 1. The body wafer 1 is etched using the resist pattern 15 as a mask. Thereby, a through-hole 16 penetrating the body wafer 1 and reaching the circuit pattern 2, and a through-hole 17 penetrating the body wafer 1 from the major surface 1b and reaching the metal film 3 are formed.

Figure 6:
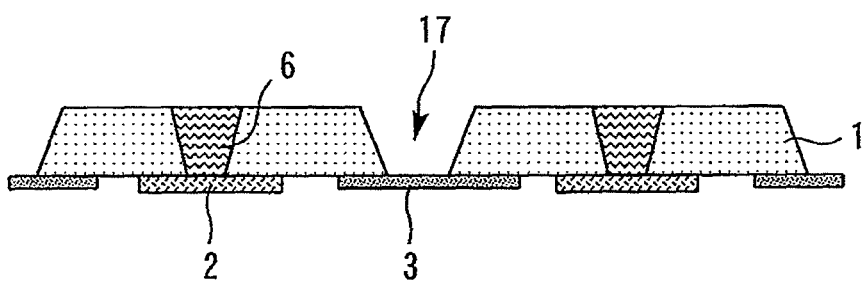

Next, as shown in FIG. 6, a penetrating electrode 6 is formed by burying a metal, such as gold, into the through-hole 16.

Figure 7:
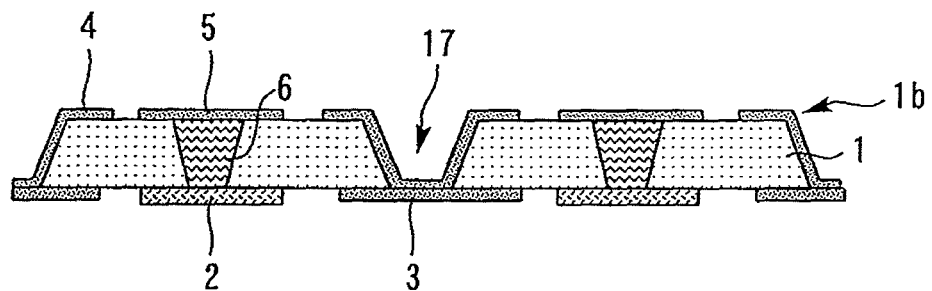

Next, as shown in FIG. 7, a metal film 4 is formed on a part of the major surface 1b of the body wafer 1, an inner wall of the through-hole 17, and the metal film 3 exposed in the through-hole 17. Then, a pad 5 for inputting/outputting signals is formed on the penetrating electrode 6 on the major surface 1b of the body wafer 1. Since dicing is later performed along the through-hole 17, the through-hole 17 is not filled with the metal film 4. The formation of the metal film 4 on dicing lines may be omitted.

Figure 8:
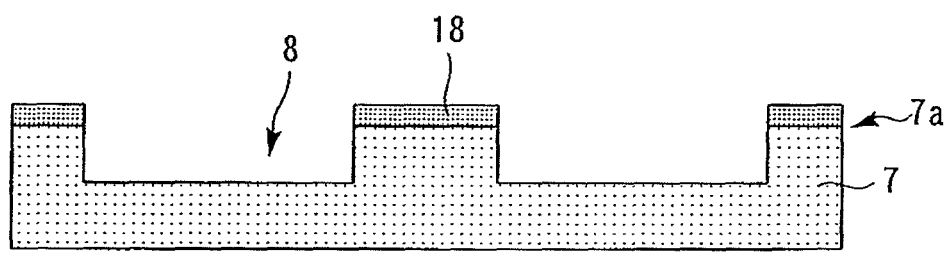

Next, as shown in FIG. 8, a resist pattern 18 is formed on the major surface 7a of the lid wafer 7. The lid wafer 7 is etched using the resist pattern 18 as a mask. Thereby, recesses 8 are formed on the major surface 7a of the lid wafer 7.

Figure 9:
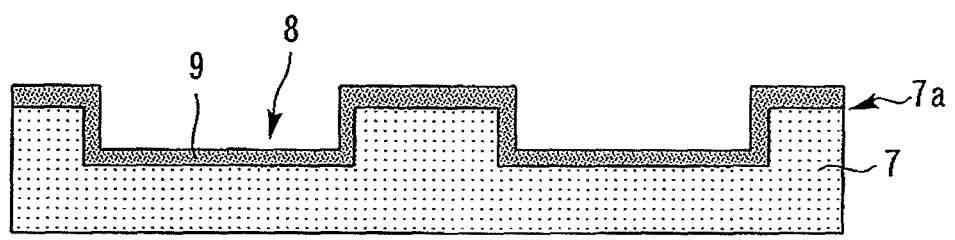

Next, as shown in FIG. 9, a metal film 9 is formed on the major surface 7a including inside the recesses 8 of the lid wafer 7.

Figure 10:
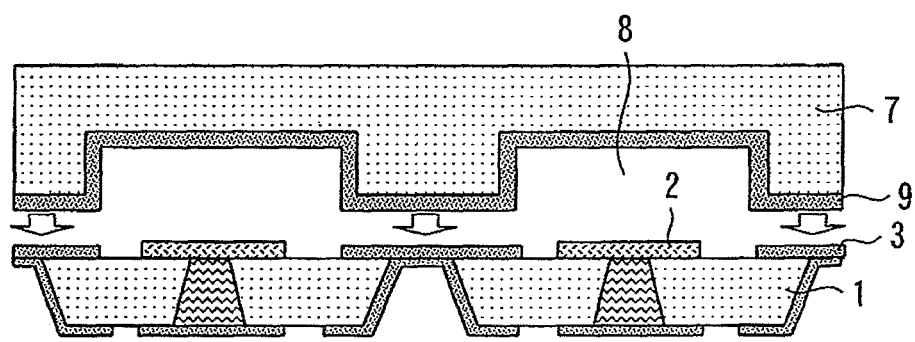

Next, as shown in FIG. 10, the recesses is made to face to the circuit pattern 2, the metal film 9 is made to contact the metal film 3, and the lid wafer 7 is joined to the body wafer 1 in a vacuum using plasma activation joining. Since the joint of the body wafer 1 with the lid wafer 7 is the same metal material, joining can be performed with thermo-compression bonding, and thermal stress is hard to remain. However, in the case of a semiconductor hard to apply a high-temperature heat process, such as GaAs, which excels in high-frequency characteristics, plasma activation joining, which can join at a low temperature, is effective.

Figure 11:
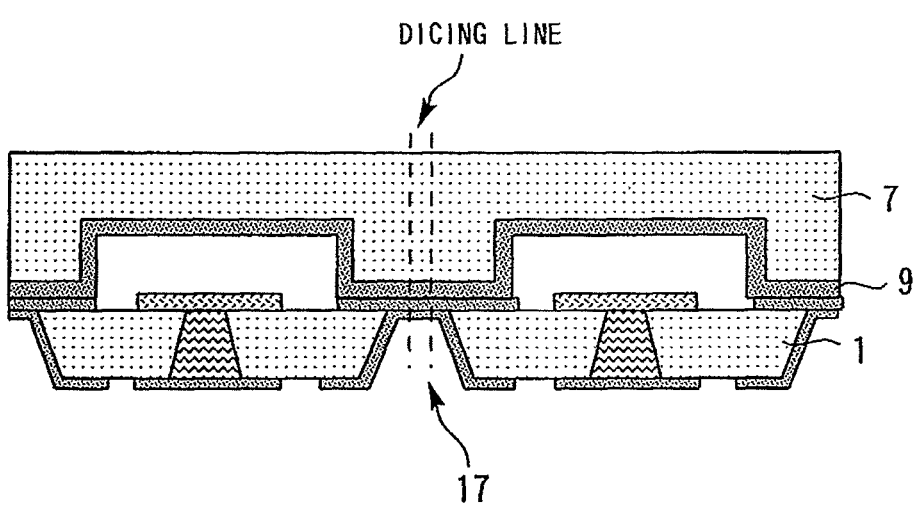
Figure 12:
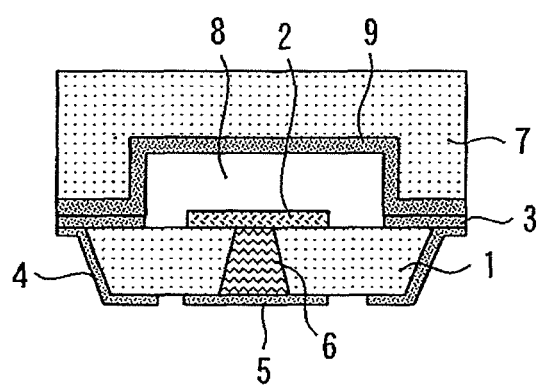

Next, as shown in FIG. 11, the joined body wafer 1 and lid wafer 7 are subjected to dicing along the through-hole 17. Thereby, as shown in FIG. 12, a semiconductor device according to the first embodiment is manufactured.

Next, the effect of the first embodiment will be described. Since the circuit pattern 2 having a transistor is air-tightly sealed by the lid wafer 7, the moisture resistance thereof can be much improved comparing to a bare chip having no lid. Since conventional chips had an anti-moisture insulating film formed on the transistor, gain was lowered by parasitic components. On the other hand, in the present embodiment, since the part above the transistor is hollow, the lowering of gain due to parasitic components can be suppressed.

Since the metal film 9 of the lid wafer 7 covering the circuit pattern 2 is grounded, the electromagnetic effect can be improved, and the external electromagnetic can be prevented. Furthermore, undesired oscillation or mismatched oscillation frequency can be suppressed. However, since no grounded metal films 3, 4, and 9 are present in the signal inputting/outputting part, electromagnetic shield is disconnected. Therefore, the distant L of the grounding bump 10 pinching the signal inputting/outputting part is made to be ½ or less the wavelength of the signals. Thereby, the entering of signals into the circuit pattern 2 can be prevented. For example, since the wavelength of 5 mm when the frequency of the signals is 60 GHz, the distant L can be 2.5 mm or less.

Since the joined body wafer 1 and lid wafer 7 are subjected to dicing along the through-hole 17, the wafer thickness can be thinned by the thickness the dicing line. Therefore, dicing can be effectively performed while securing the wafer thickness and preventing the dent of the chip. Since no thick dicing blade is required, the width of the dicing line can be thinned, and the number of chips per wafer can be increased.

Since the body wafer 1 and the lid wafer 7 can be collectively joined in the state of the wafer, the assembling costs can be significantly reduced comparing to the case wherein the body wafer 1 and the lid wafer 7 are joined chip by chip. Also since the body wafer 1 is mounted on the substrate 11 using the bump, no wire is required, and the lowering of gain and the narrowing of bands can be suppressed.

In addition, by forming the through-holes 16 and 17, the warpage of the body wafer 1 may be enlarged so as not be installed in the process device. In such a case, the through-holes 16 and 17 may be formed after joining the body wafer 1 and the lid wafer 7. Although the body wafer 1 and the lid wafer 7 are not necessarily formed using the same material, the same material is preferable when warpage due to the difference in expansion coefficients causes a problem. For protecting the product from mechanical impact during mounting, chip protecting films can be formed on the body wafer 1 and the lid wafer 7.

Second Embodiment

A method for manufacturing a semiconductor device according to the second embodiment will be described. FIGS. 13 to 18 are sectional views for illustrating the method for manufacturing a semiconductor device according to the second embodiment.

Figure 13:
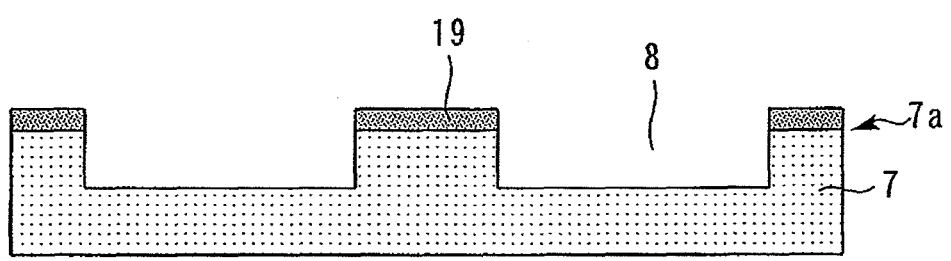
FIGS. 13 to 18 are sectional views for illustrating the method for manufacturing a semiconductor device according to the second embodiment.
Figure 14:
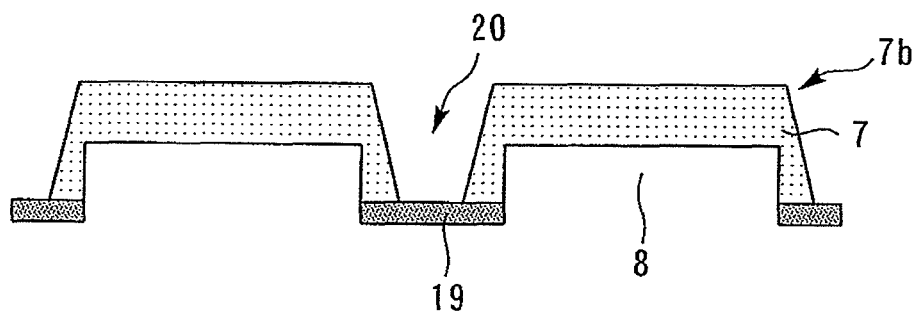

First, in the same manner as in the first embodiment, steps shown in FIGS. 4 to 7 are performed. Next, as shown in FIG. 13, a metal film 19 and a recess 8 are formed on the major surface 7a of the lid wafer 7. Next, as shown in FIG. 14, a through-hole 20 penetrating the lid wafer 7 from the major surface 7b of the lid wafer 7 and reaching the metal film 19 is formed.

Figure 15:
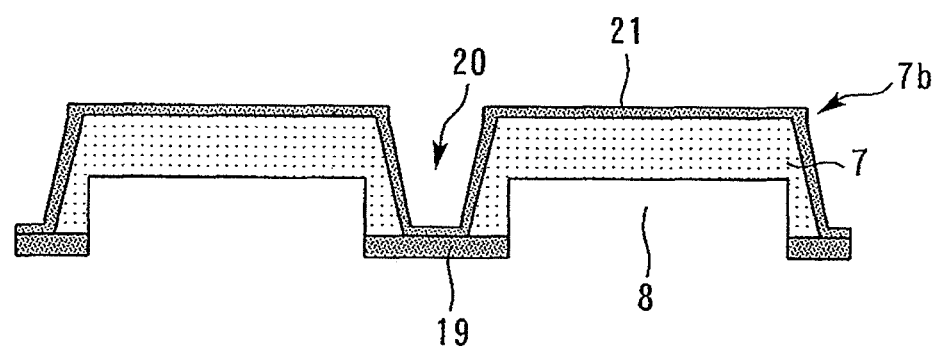

Next, as shown in FIG. 15, a metal film 21 is formed on the major surface 7b of the lid wafer 7, the inner wall of the through-hole 20, and the metal film 19 exposed in the through-hole 20.

Figure 16:
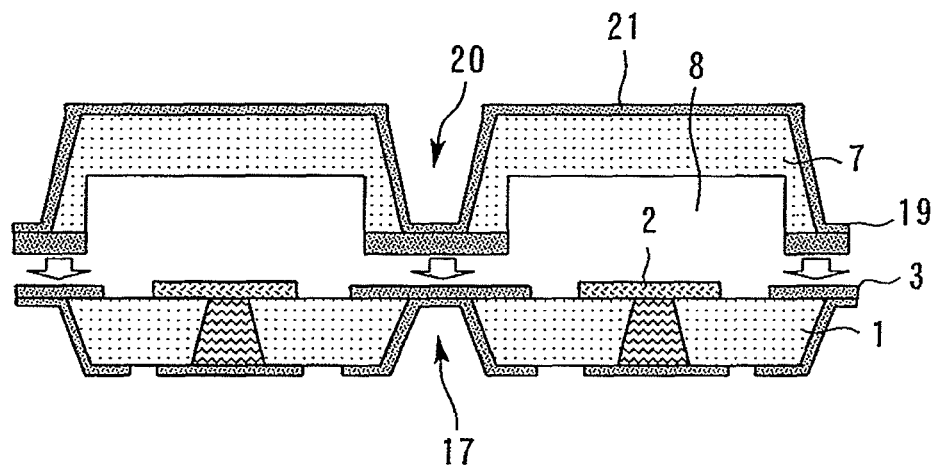

Next, as shown in FIG. 16, a recess 8 is made to face to the circuit pattern 2, the through-hole 17 is aligned with the through-hole 20, and the metal film 3 is made to contact the metal film 19 to join the lid wafer 7 to the body wafer 1.

Figure 17:
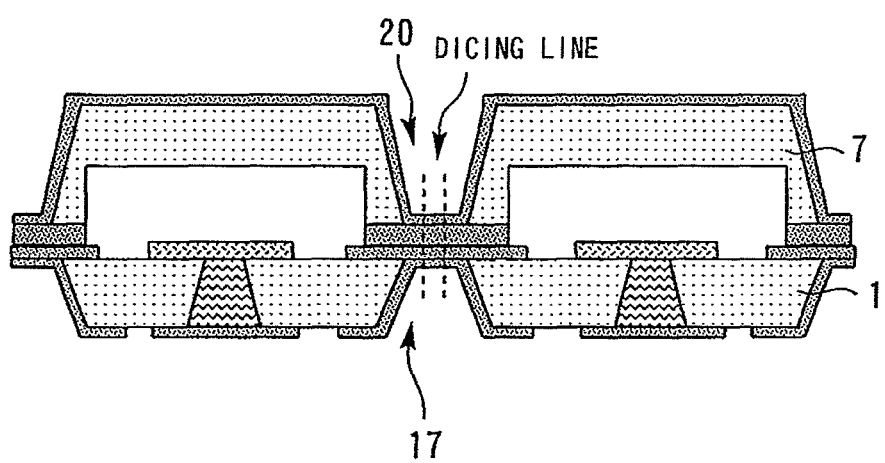
Figure 18:
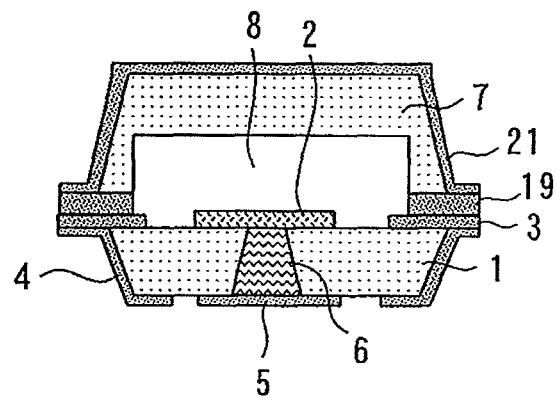

Next, as shown in FIG. 17, the joined body wafer 1 and the lid wafer 7 is subjected to dicing along the through-holes 17 and 20. Thereby, as shown in FIG. 18, the semiconductor device according to the second embodiment is manufactured.

Next, the effect of the second embodiment will be described. In the second embodiment, a metal film 21 for electromagnetic shielding is formed on the major surface 7b side of the lid wafer 7. In this case, also, the same effect as in the first embodiment can be obtained. A through-hole 20 is also formed on the lid wafer 7, and by performing dicing along the through-holes 17 and 20, dicing can be further efficiently performed. For maintaining wafer strength, it is not required to provide through-holes 17 and 20 on entire dicing line (back direction of paper).

When the semiconductor wafer is thinned, the semiconductor wafer normally warps in the direction where the metal film is formed due to the difference of the coefficient of expansion between the semiconductor wafer and the metal film. In the case of the second embodiment, since the warping directions of the body wafer 1 and the lid wafer 7 are opposite, the warpage of each wafer is offset, and the warpage of the wafer after joining can be relieved. In addition, since the grounded metal film 21 is in the major surface 7b side of the lid wafer 7, the interference to the circuit pattern 2 by the grounded metal film 21 can be reduced.

Third Embodiment

A method for manufacturing a semiconductor device according to the third embodiment will be described. FIGS. 19 to 26 are sectional views for illustrating the method for manufacturing a semiconductor device according to the third embodiment.

Figure 19:
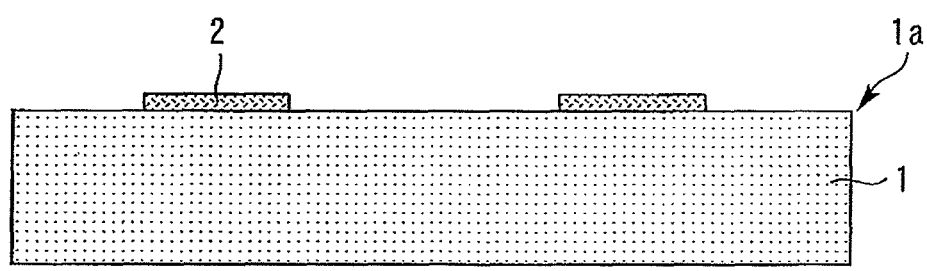
FIGS. 19 to 26 are sectional views for illustrating the method for manufacturing a semiconductor device according to the third embodiment.

First, as shown in FIG. 19, a circuit pattern 2 is formed on the major surface 1a of the body wafer 1.

Figure 20:
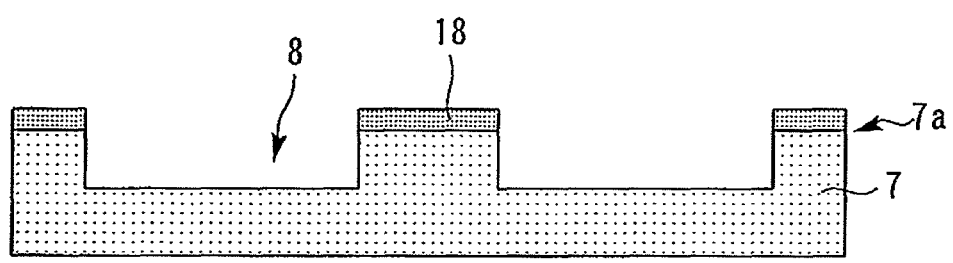

Next, as shown in FIG. 20, a resist pattern 18 is formed on the major surface 7a of the lid wafer 7. The lid wafer 7 is subjected to etching using the resist pattern 18 as a mask. Thereby, a recess 8 is formed on the major surface 7a of the lid wafer 7.

Figure 21:
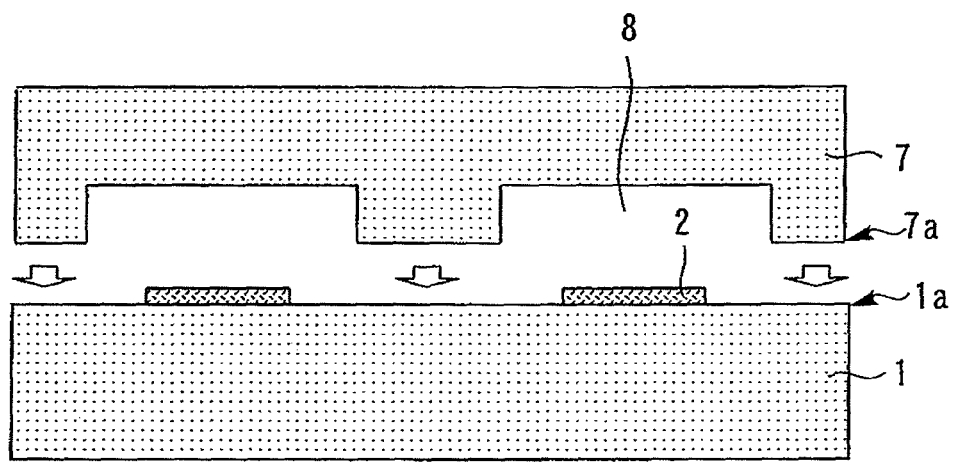

Next, as shown in FIG. 21, the recess 8 is made to face to the circuit pattern 2, the semiconductors on the major surface 1a of the body wafer 1 are made to contact the semiconductors on the major surface 7a of the lid wafer 7, and the lid wafer 7 is joined to the body wafer 1 using plasma activation joining or the like.

Figure 22:
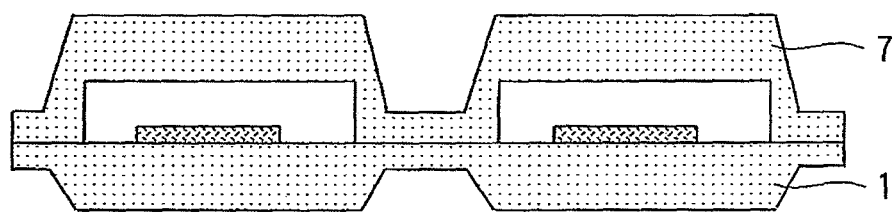
Figure 23:
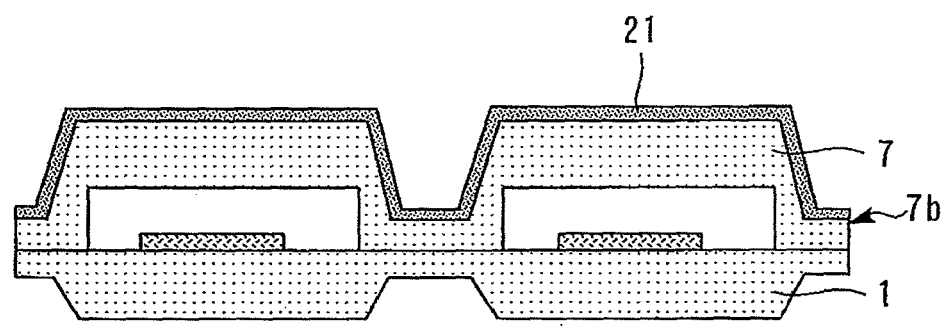

Next, as shown in FIG. 22, the body wafer 1 and the lid wafer 7 are thinned, and chip boundary parts are etched. Next, as shown in FIG. 23, a metal film 21 is formed on the major surface 7b of the lid wafer 7.

Figure 24:
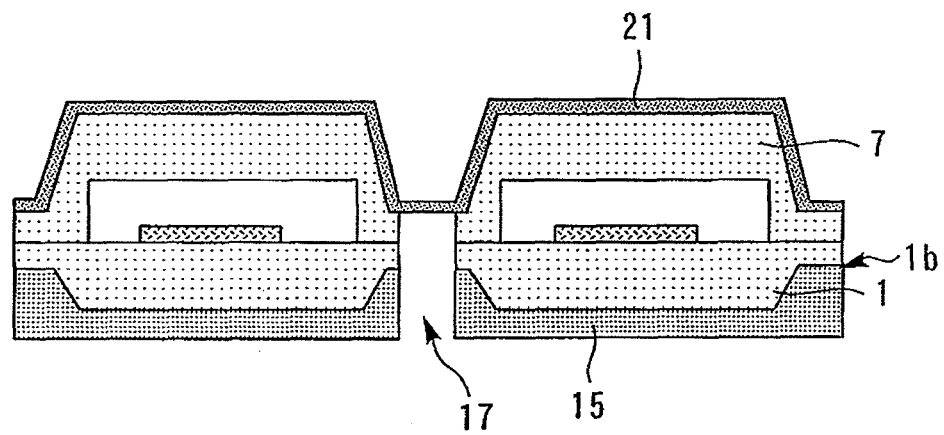

Next, as shown in FIG. 24, a resist pattern 15 is formed on the major surface 1b of the body wafer 1. The body wafer 1 and the lid wafer 7 are subjected to etching using the resist pattern 15 as a mask. Thereby, a through-hole 17 penetrating the body wafer 1 and the lid wafer 7 from the major surface 1b of the body wafer 1 and reaching the metal film 21 is formed.

Figure 25:
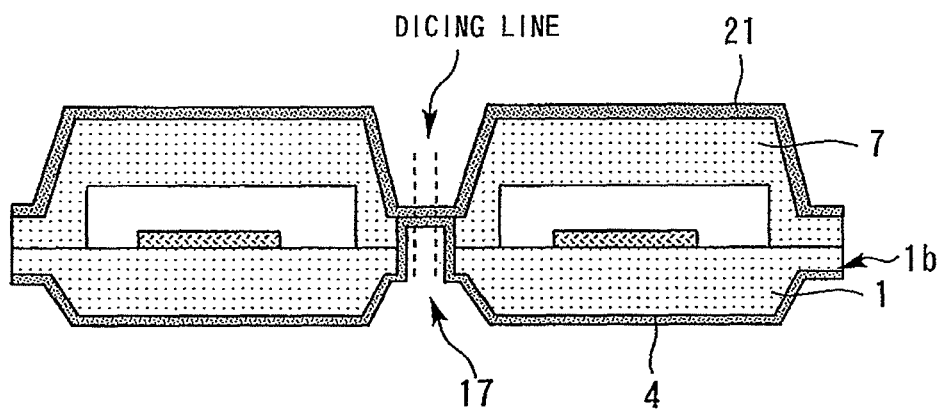

Next, as shown in FIG. 25, a metal film 4 is formed on the metal film 21 exposed on the major surface 1b of the body wafer 1, on the inner wall of the through-hole 17, and in the through-hole 17. Since dicing is later performed along the through-hole 17, the through-hole 17 is not filled with the metal film 4. The metal film 4 on the dicing line can be omitted.

Next, the joined body wafer 1 and lid wafer 7 are subjected to dicing along the through-hole 17. Thereby, the semiconductor device according to the third embodiment is manufactured.

Next, the effect of the third embodiment will be described. In the third embodiment, a metal film 21 for electromagnetic shielding is formed in the major surface 7b side of the lid wafer 7. In this case, the same effect as in the first embodiment can also be obtained. Since the joined body wafer 1 and lid wafer 7 are subjected to dicing along the through-hole 17, the wafer thickness can be thinned by the thickness the dicing line. Therefore, dicing can be effectively performed while securing the wafer thickness and preventing the dent of the chip. Since no thick dicing blade is required, the width of the dicing line can be thinned, and the number of chips per wafer can be increased.

Also in the third embodiment, when the lid wafer 7 is joined to the body wafer 1, semiconductors are joined. When metals are joined as in the first and second embodiments, heating is required depending on conditions or materials. Whereas in the third embodiment, since semiconductors have small surface roughness than metals, and the joining surfaces between semiconductors can be kept flattened, wafers can be joined by surface activation at normal temperatures. Therefore, the lowering of throughput due to temperature elevating and lowering can be suppressed.

Figure 26:
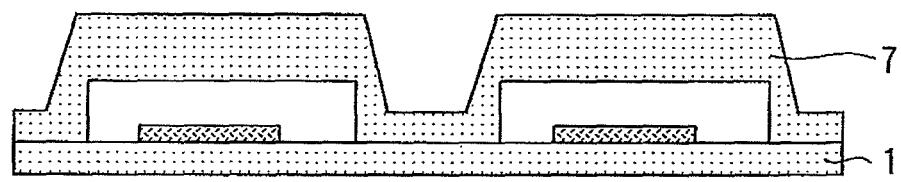

In the above-described example, although the chip boundary part is subjected to etching for the body wafer 1 and the lid wafer 7 as shown in FIG. 22, only plate thinning without etching may be used as long as strength can be maintained. For example, as shown in FIG. 26, etching of the chip boundary part in the body wafer 1 can be omitted.

Fourth Embodiment

Figure 27:
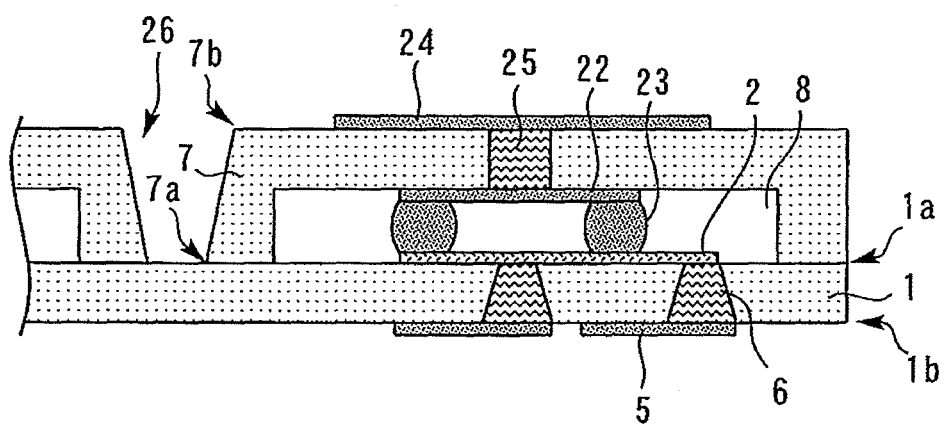
FIG. 27 is a sectional view showing a semiconductor device according to the fourth embodiment.

FIG. 27 is a sectional view showing a semiconductor device according to the fourth embodiment. The semiconductor device is a receiver circuit having a low-noise amplifier (LNA), a mixer, and an antenna.

A circuit pattern 2 is formed on the major surface 1a of the body wafer 1. The circuit pattern 2 has an LNA and a mixer. A pad 5 for inputting/outputting signals is formed on the major surface 1b of the body wafer 1. The circuit pattern 2 is connected to the pad 5 for inputting/outputting signals by the penetrating electrode 6 penetrating the body wafer 1. In addition, although not shown in the drawing, penetrating electrodes and pads for circuit grounding are also formed.

A recess 8 is formed on the major surface 7a of the lid wafer 7. A circuit pattern 22 is formed in the recess 8 of the lid wafer 7. The lid wafer 7 is joined to the body wafer 1 by facing the recess 8 to the circuit pattern 2. The body wafer 1 is joined to the lid wafer 7 by each other's semiconductors.

The circuit pattern 2 and the circuit pattern 22 are connected by bumps 23. The circuit pattern 24 is formed on the major surface 7b of the lid wafer 7. The circuit pattern 24 has an antenna. The circuit pattern 22 and the circuit pattern 24 are connected by the penetrating electrode 25 penetrating the lid wafer 7. A through-hole 26 is formed so as to facilitate dicing in the same manner as in the first embodiment.

Next, the effect of the fourth embodiment will be described. In the present embodiment, circuit patterns 2, 22, and 24 can be three-dimensionally laminated, the chip size can be more reduced than the device wherein the circuit pattern on the two-dimensionally plane.

Particularly in the millimeter wave band, the loss of signal strength between the antenna and the LNA is increased corresponding to wiring length. Whereas in the present embodiment, the distance between them is shortened in comparison with the device wherein they are connected by a wire, the loss can be minimized. Although a GaAs substrate is frequently used in high-frequency circuits, when GaAs substrate, which is a semi-insulating substrate, is used, loss can be suppressed in comparison with a Si substrate.

In order to further reduce the signal loss in the entire chip, all the penetrating electrodes through which high-frequency signals are passed are preferably short. Therefore, the body wafer 1 and the lid wafer 7 are preferably thin. Although the wafer is thinned, since the bumps 23 function as supports, the dent of the chip can be suppressed. Furthermore, when the wafer is thinned, since the distance with the adjacent line can be narrowed, a high-density layout can be obtained. Therefore, the improvement of reception properties owing to decreased loss and the reduction of the chip size can be simultaneously achieved.

In addition, if an oscillator, a power amplifier, and a switch are formed in the circuit pattern 2, a receiver-transmitter can also be composed by a body wafer 1 alone. Heretofore, since the circuit chip and the antenna chip were separated, the assembly had to be performed one by one. In the present embodiment, a receiver-transmitter having both a circuit and an antenna can be formed only by joining wafers to each other to be subjected to dicing, and thereby the time and costs required for assembly can be significantly reduced.

In addition, if the isolation of the circuit pattern 2 of the body wafer 1 and the circuit pattern 22 of the lid wafer 7 is poor, a grounding layer can be provided in the recess 8. In order to strengthen electromagnetic shielding properties, a metal film may be formed in the through-hole 26 by plating or the like.

Fifth Embodiment

Figure 28:
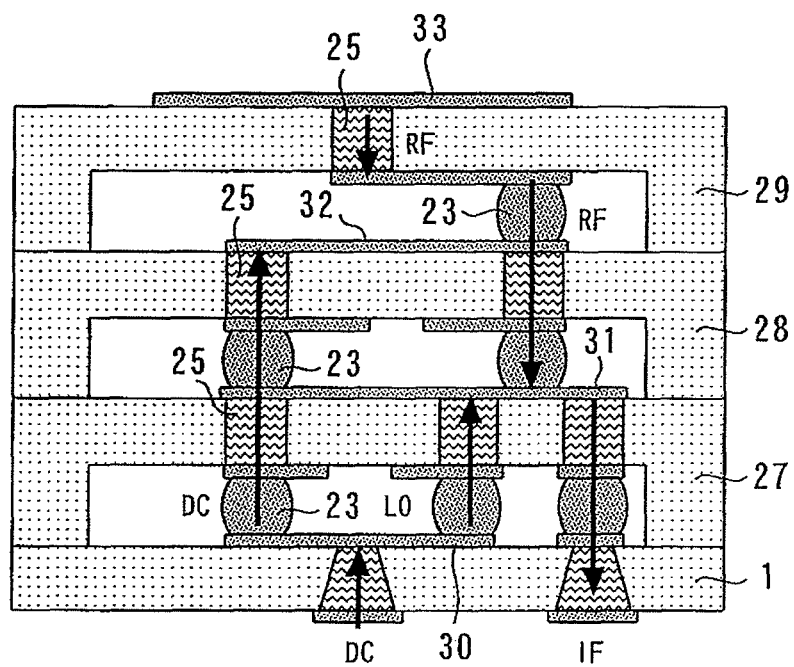
FIG. 28 is a sectional view showing a semiconductor device according to the fifth embodiment.
Figure 29:
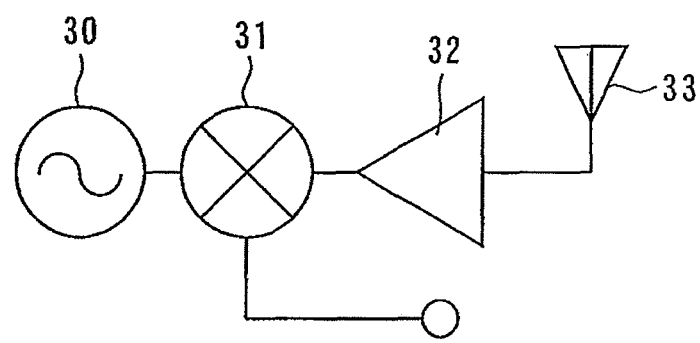
FIG. 29 is a circuit diagram of a semiconductor device according to the fifth embodiment.

FIG. 28 is a sectional view showing a semiconductor device according to the fifth embodiment. FIG. 29 is a circuit diagram of a semiconductor device according to the fifth embodiment. Three lid wafers 27, 28, and 29 are laminated on a body wafer 1. The configurations of the lid wafer 27, 28, and 29 are same as the configuration of the lid wafer 7 in the fourth embodiment. An oscillator circuit 30 is formed on the body wafer 1; a mixer circuit 31 is formed on the lid wafer 27; an LNA circuit 32 is formed on the lid wafer 28; and an antenna 33 is formed on the lid wafer 29.

The high-frequency signals RF received using the antenna 33 are inputted into the LNA circuit 32 via the bump 23, the penetrating electrode 25 and the like. The high-frequency signals RF are amplified by the LNA circuit 32, and inputted into the mixer circuit 31. The local oscillation signals LO required for mixer operation are generated in the oscillator circuit 30, and inputted into the mixer circuit 31. The intermediate frequency signals IF generated in the mixer circuit 31 are outputted from the major surface 1b of the body wafer 1 into the mother board. The direct-current voltage DC is supplied to the transistors in every layer.

In the present embodiment, since the circuit patterns can be three-dimensionally laminated, the chip size can be reduced in the same manner as in the fourth embodiment, and the mounting time and costs can be greatly reduced. Particularly, in the millimeter wave band, wherein the circuit properties are sensitive to the assembly accuracy, this advantage is significant. In the present embodiment, since four wafers are joined, the respective wafers need to be thinned. In this case, also, since the bump 23 functions as a support, the dent of the chip can be suppressed.

Sixth Embodiment

Figure 30:
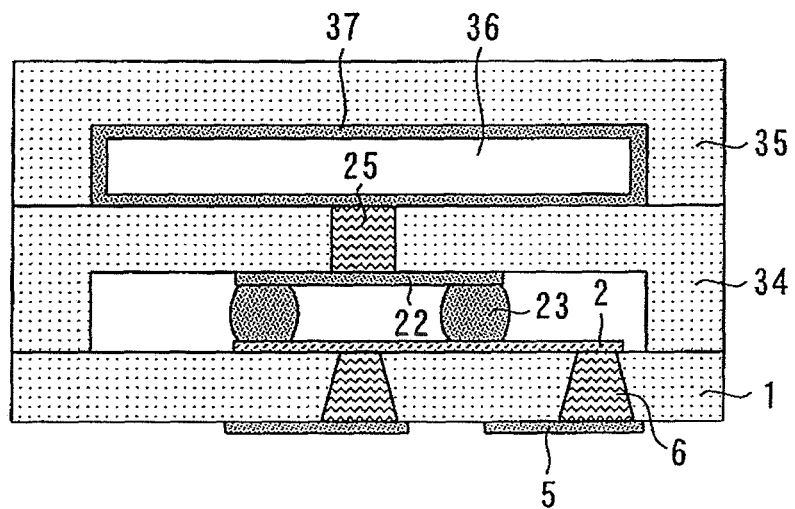
FIG. 30 is a sectional view showing a semiconductor device according to the sixth embodiment.

FIG. 30 is a sectional view showing a semiconductor device according to the sixth embodiment. Two lid wafers 34 and 35 are laminated on a body wafer 1. The configuration of the lid wafer 34 is same as the configuration of lid wafer 7 of the fourth embodiment. A metal film 37 is formed on the entire inner wall of the recess 36 of the lid wafer 35, and the recess 36 is hollowed to form a waveguide resonator. Since the resonator having a higher Q value than the Q value of the resonator by the circuit pattern can be constituted on a chip, the oscillation properties can be improved. Also since circuit patterns can be three-dimensionally laminated, the chip size can be reduced as in the fourth and fifth embodiments. A dielectric material may be buried in the waveguide.

Seventh Embodiment

Figure 31:
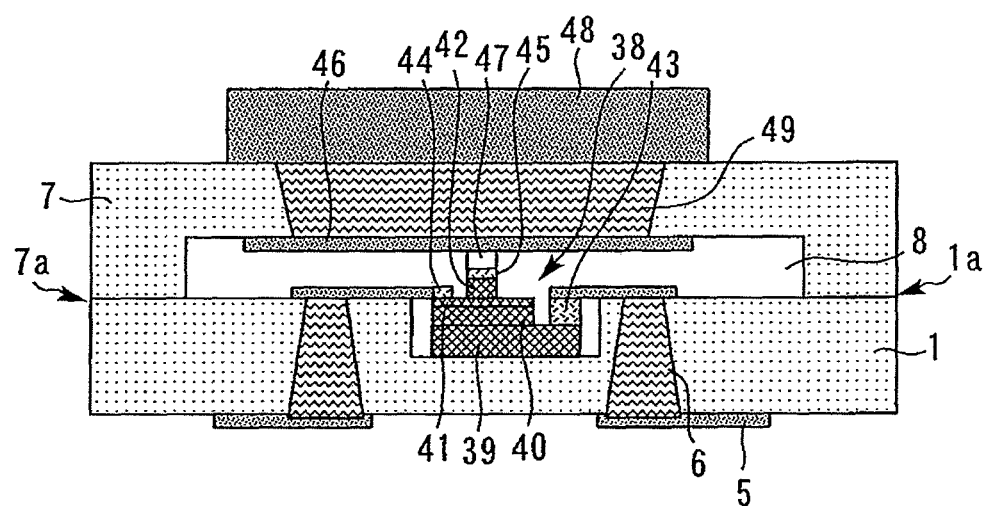
FIG. 31 is a sectional view showing a semiconductor device according to the seventh embodiment.

FIG. 31 is a sectional view showing a semiconductor device according to the seventh embodiment. A transistor 38 is formed on the major surface 1a of a body wafer 1. The transistor 38 has a sub-collector layer 39, a collector layer 40, a base layer 41, an emitter layer 42, a collector 43, a base 44, and an emitter 45. Although the transistor 38 is an HBT (hetero-junction bipolar transistor) here, the transistor 38 can be a field effect transistor.

A recess 8 is formed on the major surface 7a of the lid wafer 7. A grounding electrode 46 is formed in the recess 8 of the lid wafer 7. The lid wafer 7 is joined to the body wafer 1 with the recess 8 facing to the transistor 38. The base 44 and the collector 43 of the transistor 38 are connected to the external circuit via the penetrating electrodes 6.

The emitter 45 of the transistor 38 (source in the case of a field effect transistor) and the grounding electrode 46 are connected by a bump 47. A radiator 48 is formed on the major surface 7b of the lid wafer 7. The radiator 48 is grounded. The grounding electrode 46 is connected to the radiator 48 by the penetrating electrode 49 penetrating the lid wafer 7.

Thereby, heat dissipation can be improved, and parasitic inductance can be reduced in comparison with the conventional device wherein the emitter of the HBT is grounded and heat-radiated via the air bridge and the through-hole of the body wafer. Therefore, gain is much improved especially in the millimeter wave band, the heat dissipation is improved and thereby an output characteristic is also improved.

Eighth Embodiment

Figure 32:
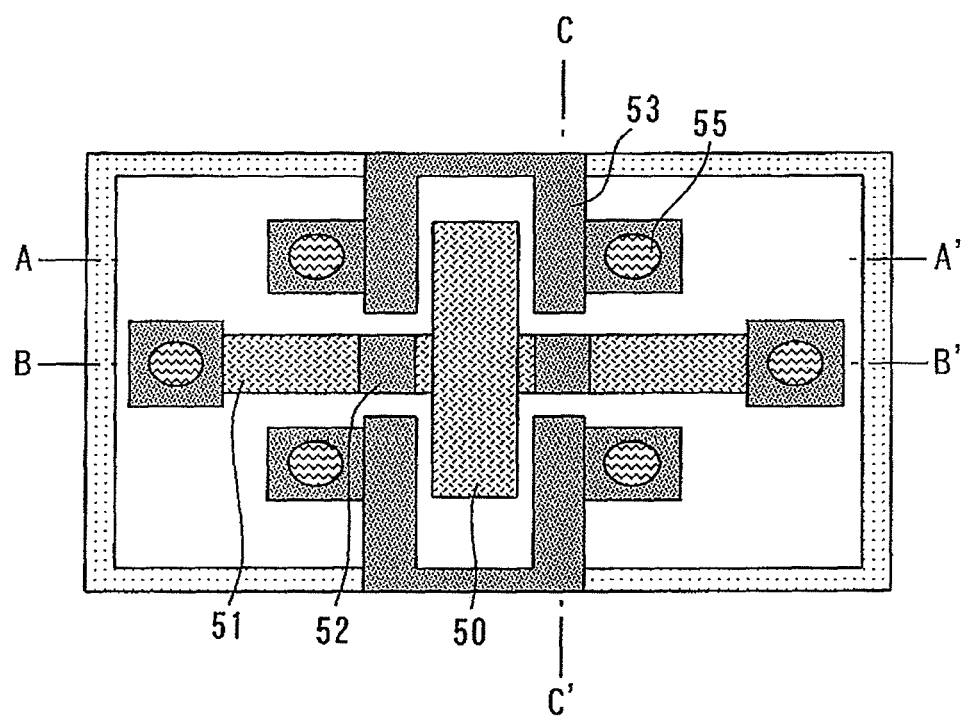
FIG. 32 is a plan view showing a semiconductor device according to the eighth embodiment.
Figure 33:
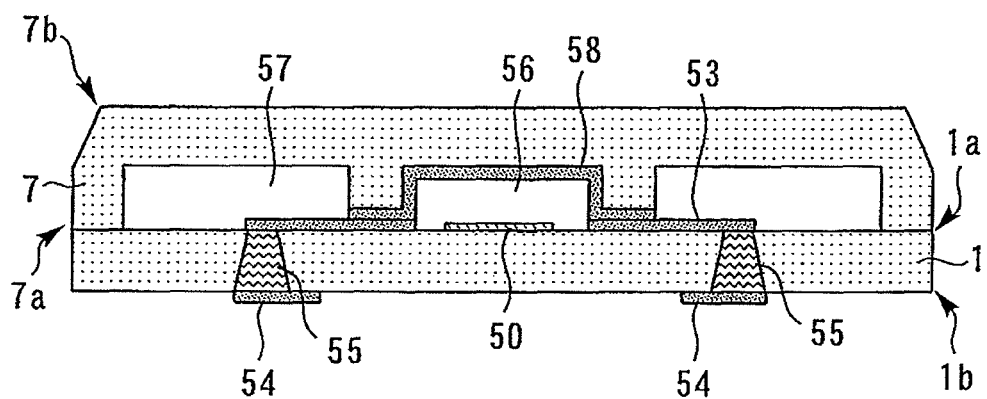
FIG. 33 is a sectional view taken along the line A-A' in FIG. 32.
Figure 34:
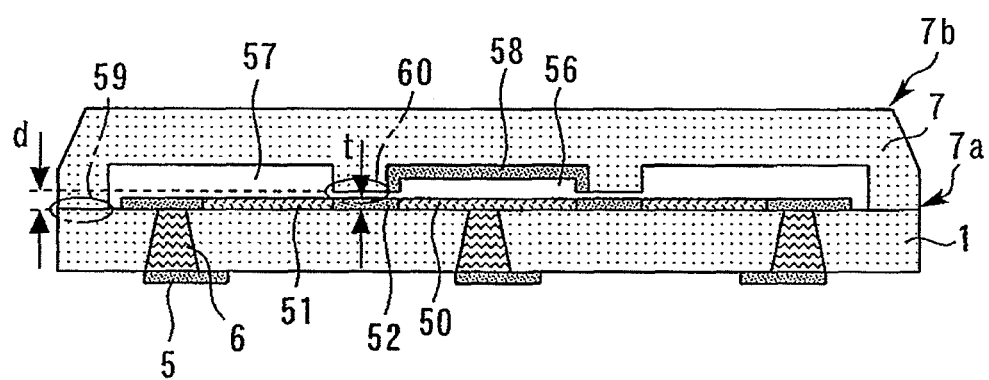
FIG. 34 is a sectional view taken along the line B-B' in FIG. 32.
Figure 35:
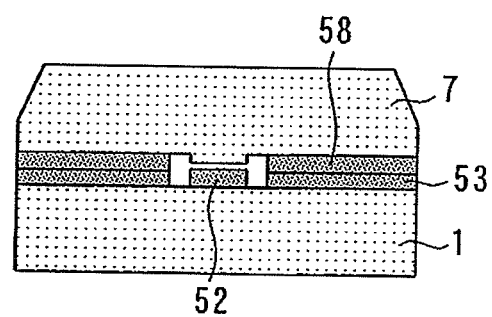
FIG. 35 is a sectional view taken along the line C-C' in FIG. 32.

FIG. 32 is a plan view showing a semiconductor device according to the eighth embodiment. FIG. 33 is a sectional view taken along the line A-A' in FIG. 32. FIG. 34 is a sectional view taken along the line B-B' in FIG. 32. FIG. 35 is a sectional view taken along the line C-C' in FIG. 32.

Circuit patterns 50 and 51, a wiring 52, and a metal film 53 are formed on the major surface 1a of the body wafer 1. The circuit pattern 50 and the circuit pattern 51 are connected by the wiring 52. The circuit pattern 50 has an oscillator and a switch. The circuit pattern 51 has an amplifier. A grounding pad 54 is formed on the major surface 1b of the body wafer 1. The metal film 53 and the grounding pad 54 are connected by a penetrating electrode 55.

Recesses 56 and 57 are formed on the major surface 7a of the lid wafer 7. A metal film 58 is formed in the recess 56 of the lid wafer 7. The lid wafer 7 is joined to the body wafer 1 by facing the recess 56 to the circuit pattern 50 and facing the recess 57 to the circuit pattern 51. Here, semiconductors are joined to one another on the ends of the chip; and the metal film 58 and the metal film 53 are joined inside the chip. The metal film 58 formed in the recess 56 of the lid wafer 7 is grounded via the metal film 53, the penetrating electrode 55, and the grounding pad 54.

The major surface 7a of the lid wafer 7 has a region 59 joined to the body wafer 1, and a region 60 present between the recess 56 and the recess 57, and facing to the wiring 52. The region 60 sags downwards than the region 59. The difference d of the height between the region 60 and the region 59 is larger than the thickness t of the wiring 52. Therefore, the region 60 separates from the wiring 52.

Next, a method for manufacturing a semiconductor device according to the eighth embodiment will be described. FIGS. 36 to 43 are sectional views for illustrating the method for manufacturing a semiconductor device according to the eighth embodiment. Here, FIGS. 36 to 40 and FIG. 43 correspond to FIG. 33, FIG. 41 corresponds to FIG. 34, and FIG. 42 corresponds to FIG. 35.

Figure 36:
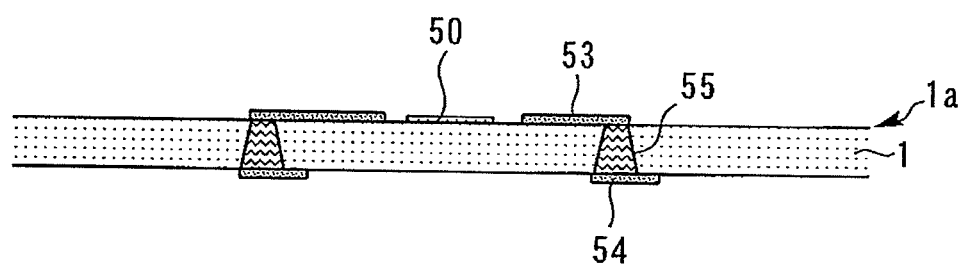
FIGS. 36 to 43 are sectional views for illustrating the method for manufacturing a semiconductor device according to the eighth embodiment.

First, as shown in FIG. 36, circuit patterns 50, 51, and a wiring 52 are formed on the major surface 1a of the body wafer 1. Furthermore, a penetrating electrode 55 and a grounding pad 54 are formed.

Figure 37:
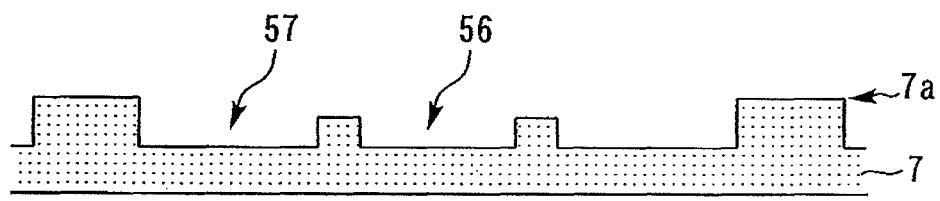
Figure 38:
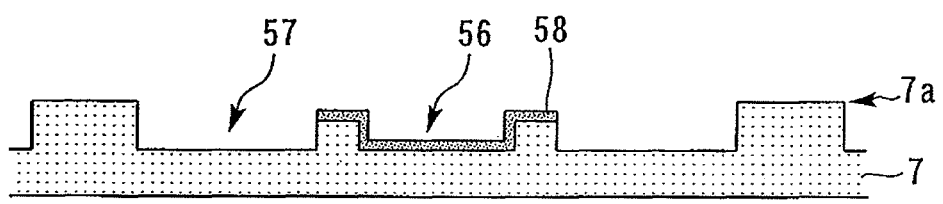
Figure 39:
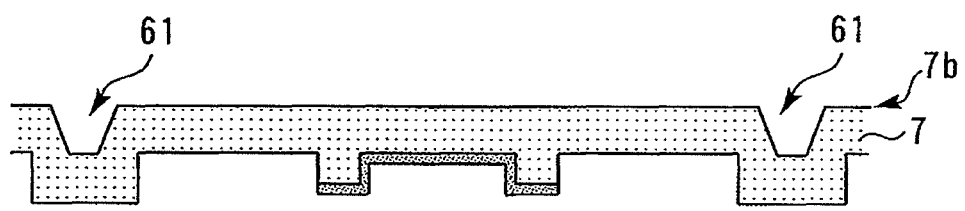

Next, as shown in FIG. 37, recesses 56 and 57 are formed on the major surface 7a of the lid wafer 7. Next, as shown in FIG. 38, a metal film 58 is formed in the recess 56 of the lid wafer 7. Then, as shown in FIG. 39, a recess 61 is formed on the major surface 7b of the lid wafer 7.

Figure 40:
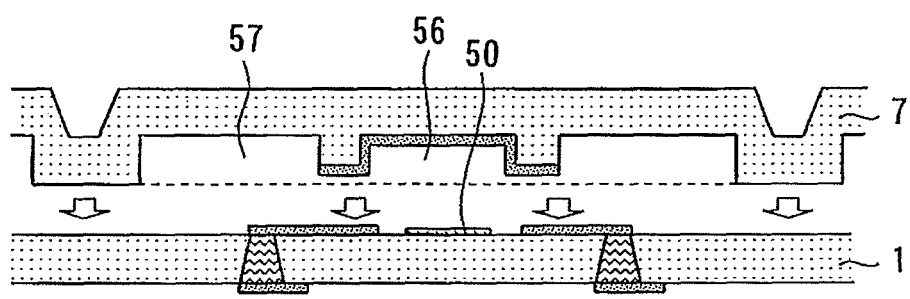
Figure 41:
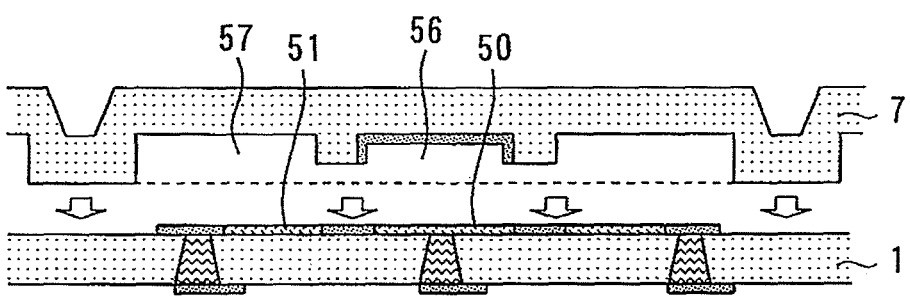
Figure 42:
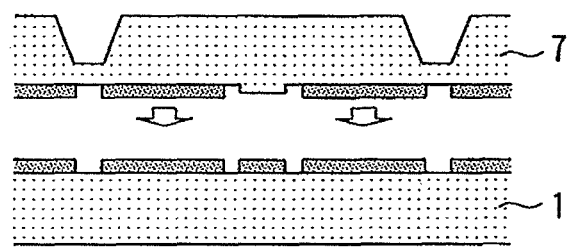
Figure 43:
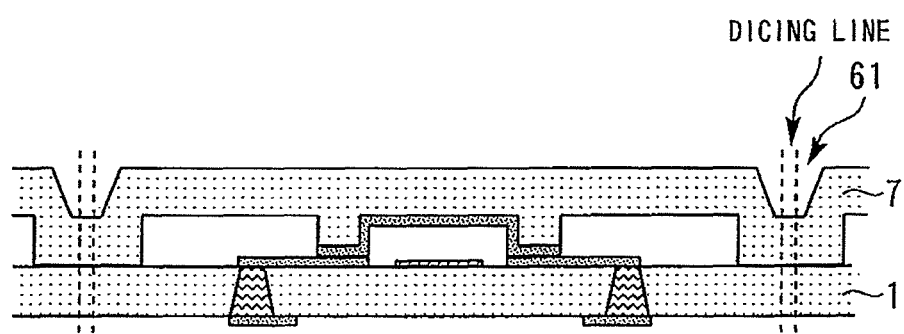

Next, as shown in FIGS. 40 to 42, the recess 56 is made to face to the circuit pattern 50 and the recess 57 is made to face to the circuit pattern 51, and the lid wafer 7 is joined to the body wafer 1. Next, as shown in FIG. 43, the joined body wafer 1 and lid wafer 7 are subjected to dicing along the recess 61. Thereby, the semiconductor device according to the eighth embodiment is manufactured.

Next, the advantage of the eighth embodiment will be described. Since the metal film 58 of the lid wafer 7 covering the circuit pattern 50 is grounded, the electromagnetic shield effect can be improved, and the external electromagnetic noise can be prevented. Furthermore, undesired oscillation or the misaligned oscillation frequency can be suppressed.

In the present embodiment, since the amplifier and the oscillator are formed on a chip, the device size and the manufacturing costs can be reduced in comparison with the device wherein the amplifier and the oscillator are formed on separate chips. In addition, although the amplifier and the oscillator can be separated by making the intermediate layer in the fifth embodiment to be a grounding electrode, the present embodiment is effective because a layer is added for electromagnetic shielding.

In addition, the region 60 present between the recess 56 and the recess 57 on the major surface 7a of the lid wafer 7 is separated from the wiring 52. Therefore, the wiring 52 that connects the circuit pattern 50 to the circuit pattern 51 is not joined with the lid wafer 7. Consequently, the signals generated by the oscillator are inputted to the amplifier.

Since the joined body wafer 1 and the lid wafer 7 are subjected to dicing along the recess 61, the wafer thickness can be thinned by the dicing line. Therefore, dicing can be efficiently performed while securing the wafer thickness and preventing the dent of the device. In addition, since a thick dicing blade is not required, the width of the dicing line can be reduced, and the number of chips per wafer can be increased.

In the above-described first to eighth embodiments, dicing with a dicing blade is used as the method for separating a wafer into respective chips. However, the method is not limited to dicing, and other methods for separating the chip, such as scribing and laser fusing, can also be used.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-170570, filed on Jul. 29, 2010 including specification, claims, drawings and summary, on which the Convention priority of the present application is based, are incorporated herein by reference in its entirety.

What is claimed is:

1. A method for manufacturing a semiconductor device comprising:

forming a circuit pattern and a first metal film on a first major surface of a body wafer having the first major surface and a second major surface facing the first major surface;

forming a through-hole penetrating the body wafer from the second major surface of the body wafer and reaching the first metal film;

forming a second metal film on a part of the second major surface of the body wafer, on an inner wall of the through-hole, and on the first metal film exposed in the through-hole;

forming a recess on a first major surface of a lid wafer having the first major surface of the lid wafer and a second major surface facing the first major surface of the lid wafer;
forming a third metal film on the first major surface, including inside the recess, of the lid wafer;
with the recess facing the circuit pattern, and the first metal film contacting the third metal film, joining the lid wafer to the body wafer; and
dicing the joined body wafer and lid wafer along the through-hole.

2. The method of manufacturing a semiconductor device according to claim 1, including
forming the recess in the first major surface of the lid wafer, deeper than thickness of the third metal film plus projection of the circuit pattern from the first major surface of the body wafer, and
before joining the lid wafer to the body wafer, aligning the circuit pattern with the recess so that a first part of the third metal film, in the recess, is spaced from the circuit pattern when a second part of the third metal film, outside the recess, is contacting the first metal film and, thereafter, joining the lid wafer to the body wafer.

3. A method of manufacturing semiconductor devices comprising:
preparing a body wafer having opposed first and second major surfaces by
forming first and second circuit patterns, spaced apart from each other, on the first major surface of the body wafer,
forming first metal films on the first major surface of the body wafer at first, second, and third locations, spaced apart from each other and from the first and second circuit patterns, wherein the first circuit pattern is located between the first and second locations, and the second circuit pattern is located between the second and third locations on the first major surface of the body wafer,
forming first, second, and third through-holes extending entirely through the body wafer, from the second major surface to and reaching the first major surface of the body wafer, respectively at and exposing the first circuit pattern, the second location of one of the first metal films, and the second circuit pattern,
exposing, from the second major surface of the body wafer, the first metal films at the first and third locations, and
forming second metal films, including forming one of the second metal films on part of the second major surface of the body wafer, on a surface of the body wafer in the second through-hole, and on and in contact with the first metal film at the second location, and forming additional second metal films on and in contact with the first metal films at the first and third locations that are exposed and on side walls of the body wafer;
preparing a lid wafer having opposed first and second major surfaces by
forming first and second recesses in the lid wafer, extending into the lid wafer from the first major surface of the lid wafer, and
forming a third metal film covering the first major surface of the lid wafer, including covering inside surfaces of the first and second recesses of the lid wafer;
joining the body wafer to the lid wafer by aligning the first and second recesses directly opposite the first and second circuit patterns, respectively, bringing the third metal film into contact with the first metal films at each of the first, second, and third locations, and bonding the third metal film to the first metal films so that the first and second circuit patterns are enclosed within the first and second recesses, between the first major surface of the body wafer and the first major surface of the lid wafer; and
dicing the body wafer and the lid wafer joined to the body wafer along a direction transverse to the first major surfaces of the body wafer and the lid wafer, through the first, second, and third metal films and through and along the second through-hole.

4. The method of manufacturing semiconductor devices according to claim 3, including forming the first and second recesses in the lid wafer, at the first major surface of the lid wafer, deeper than thickness of the third metal film plus projection of the first and second circuit patterns from the first major surface of the body wafer, so that, after joining the lid wafer to the body wafer, the first and second circuit patterns are spaced from the third metal film in the first and second recesses when the third metal film, outside the first and second recesses, is in contact with the first metal films at the first and third locations.

5. The method of manufacturing semiconductor devices according to claim 3, including, before forming the second metal films, filling the first and third through-holes with a metal in contact with the first and second circuit patterns, respectively, as via holes, providing electrical access from the second metal films to the first and second circuit patterns in the semiconductor devices.

6. A method of manufacturing a semiconductor device comprising:
preparing a body wafer having opposed first and second major surfaces by
forming a circuit pattern on the first major surface of the body wafer,
forming first metal films on the first major surface of the body wafer at first and second locations, spaced apart from each other and from the circuit pattern, wherein the circuit pattern is located between the first and second locations on the first major surface of the body wafer,
forming a through-hole extending entirely through the body wafer, from the second major surface to and reaching the first major surface of the body wafer at and exposing the first circuit pattern,
exposing, from the second major surface of the body wafer, and the first metal films at the first and second locations, and
forming second metal films, including forming the second metal films on parts of the second major surface of the body wafer and on and in contact with the first metal films at the first and second locations that are exposed and on side walls of the body wafer;
preparing a lid wafer having opposed first and second major surfaces by
forming a recess in the lid wafer, extending into the lid wafer from the first major surface of the lid wafer, and
forming a third metal film covering the first major surface of the lid wafer, including covering inside surfaces of the recess of the lid wafer; and
joining the body wafer to the lid wafer by aligning the recess directly opposite the circuit pattern, bringing the third metal film into contact with the first metal films at each of the first and second locations, and bonding the third metal film to the first metal films so that the circuit pattern is enclosed within the recess, between the first major surface of the body wafer and the first major surface of the lid wafer.

7. The method of manufacturing a semiconductor device according to claim 6, including forming the recess in the lid wafer at the first major surface of the lid wafer deeper than thickness of the third metal film plus projection of the circuit pattern from the first major surface of the body wafer, so that, after joining the lid wafer to the body wafer. the circuit pattern is spaced from the third metal film in the recess when the third metal film, outside the recess is in contact with the first metal films at the first and second locations.

8. The method of manufacturing a semiconductor device according to claim 6, including, before forming the second metal films, filling the through-hole with a metal in contact with the circuit pattern, as a via hole providing electrical access from one of the second metal films to the circuit pattern in the semiconductor device.

\* \* \* \* \*